(12) United States Patent
Wu et al.

(10) Patent No.: US 7,361,984 B2
(45) Date of Patent: Apr. 22, 2008

(54) CHIP PACKAGE STRUCTURE

(75) Inventors: Yan-Yi Wu, Shanghai (CN); Xin-Ming Li, Shanghai (CN); Chih-Lung Huang, Shanghai (CN)

(73) Assignees: ChipMOS Technologies (Shanghai) Ltd., Shanghai (CN); ChipMOS Technologies (Bermuda) Ltd., Hamilton (BM)

( * ) Notice: Subject to any disclaimer, the term of this patent is extended or adjusted under 35 U.S.C. 154(b) by 64 days.

(21) Appl. No.: 11/468,600

(22) Filed: Aug. 30, 2006

(65) Prior Publication Data

US 2008/0017958 A1 Jan. 24, 2008

(30) Foreign Application Priority Data

Jul. 18, 2006 (TW) .............................. 95126167 A

(51) Int. Cl.
*H01L 23/04* (2006.01)
*H01L 23/495* (2006.01)

(52) U.S. Cl. ...................... 257/698; 257/676; 257/693; 257/700; 257/E23.079; 257/E23.123; 257/E23.141

(58) Field of Classification Search ................ 257/676, 257/693, 698, 700

See application file for complete search history.

(56) References Cited

U.S. PATENT DOCUMENTS

| 6,555,918 | B2 * | 4/2003 | Masuda et al. | ............... 257/777 |
| 2002/0195691 | A1 * | 12/2002 | Schoenfeld | .................. 257/666 |
| 2003/0021990 | A1 * | 1/2003 | Tanabe et al. | ............... 428/343 |
| 2003/0153134 | A1 * | 8/2003 | Kawata et al. | ............... 438/123 |
| 2006/0186528 | A1 * | 8/2006 | Sasaki et al. | ................ 257/690 |
| 2007/0004092 | A1 * | 1/2007 | Suzuki et al. | ................ 438/123 |

* cited by examiner

*Primary Examiner*—Ngân V. Ngô
(74) *Attorney, Agent, or Firm*—J.C. Patents

(57) ABSTRACT

A chip package structure including a lead frame, at least one first bonding wire, at least one second bonding wire, third bonding wires and an encapsulant is provided. The lead frame includes a die pad, inner leads and at least one bus bar, wherein the bus bar is disposed therebetween and has a down-set with a height difference from the inner leads. The inner leads are disposed around the die pad. The chip disposed on the die pad has at least one first contact and second contacts. The first bonding wire electrically connects the first contact to the bus bar. The second bonding wire electrically connects the bus bar to one of the inner leads. The third bonding wires electrically connect the other of the inner leads to the second contacts. The lead frame, the chip, the bonding wires are wrapped inside the encapsulant.

5 Claims, 3 Drawing Sheets

CHIP PACKAGE STRUCTURE

CROSS-REFERENCE TO RELATED APPLICATION

This application claims the priority benefit of Taiwan application serial no. 95126167, filed on Jul. 18, 2006. All disclosure of the Taiwan application is incorporated herein by reference.

BACKGROUND OF THE INVENTION

1. Field of the Invention

The present invention relates to a chip package structure, and more particularly, to a chip package structure having a bus bar.

2. Description of Related Art

In the semiconductor manufacturing industry, the production of integrated circuits (IC) is mainly divided into three major stages: the integrated circuit (IC) design stage, the IC fabrication stage and the IC packaging stage.

In the integrated circuit (IC) fabrication stage, a series of processes including wafer manufacturing, integrated circuit forming and wafer sawing is sequentially performed in order to fabricate the chips. The wafer has an active surface, where active devices are formed. After forming all the integrated circuits on the wafer, a number of bonding pads is disposed on the active surface of the wafer so that each chip cut out from the wafer can electrically connect with an external carrier through these bonding pads. The carrier may be a lead frame or a package substrate. The chip can be electrically connected to the carrier by wire bonding or flip-chip bonding method so that the bonding pads on the chip are electrically connected to their corresponding contacts on the carriers to produce a chip package structure.

FIG. 1 is a top view of a conventional chip package. FIG. 2 is a schematic cross-sectional view of the chip package in FIG. 1. To facilitate the following description, the encapsulant 140 of the package is transparent in FIGS. 1 and 2 and the profile of the encapsulant 140 is outlined by dash lines. As shown in FIGS. 1 and 2, the chip package 100 includes a lead frame 110, a chip 120, a plurality of first bonding wires 130, a plurality of second bonding wires 132, a plurality of third bonding wires 134 and an encapsulant 140. The lead frame 110 includes a die pad 112, a plurality of inner leads 114 and a plurality of bus bars 116. The inner leads 114 are disposed around the die pad 112. The bus bars 116 are disposed between the die pad 112 and the inner leads 114. Furthermore, the bus bars 116 and the inner leads 114 are coplanar.

The chip 120 has an active surface 122 and a back surface 124 on the other side. The chip 120 is disposed on the die pad 112 with the back surface 124 facing the die pad 112. The chip 120 has a plurality of ground contacts 126 and a plurality of non-ground contacts 128. The non-ground contacts 128 include several power contacts and several signal contacts. The ground contacts 126 and the non-ground contacts 128 are both located on the active surface 122.

The first bonding wires 130 electrically connect the ground contacts 126 to the bus bars 116. The second bonding wires 132 electrically connect the bus bars 116 to the ground leads of the inner leads 114. The third bonding wires 134 electrically connect the other inner leads 114 to their corresponding second contacts 128. The die pad 112, the inner leads 114, the bus bars 116, the chip 120, the first bonding wires 130, the second bonding wires 132 and the third bonding wires 134 are wrapped inside the encapsulant 140.

It should be noted that the inner leads 114 and the bus bars 116 in the conventional chip package structure 100 are coplanar. Therefore, the third bonding wires 134 must jump over the bus bar 116. In other words, the third bonding wires 134 have to rise to a greater height. As a result, the third bonding wires will be subjected to a greater pull by the encapsulant 140 during the encapsulating process. Ultimately, a greater number of third boding wires 134 is shifted or broken.

SUMMARY OF THE INVENTION

Accordingly, at least one objective of the present invention is to provide a chip package structure that has a greater reliability.

At least another objective of the present invention is to provide a chip package structure having a smaller volume.

To achieve these and other advantages and in accordance with the purpose of the invention, as embodied and broadly described herein, the invention provides a chip package structure. The chip package structure includes a lead frame, a chip, at least one first bonding wire, at least one second bonding wire, a plurality of third bonding wires and an encapsulant. The lead frame includes a die pad, a plurality of inner leads and at least one bus bar. The inner leads are disposed around the die pad. The bus bar is disposed between the die pad and the inner leads. The bus bar has a down-set with a first height difference from the inner leads. The chip has an active surface and a back surface on the opposite side. The chip is disposed on the die pad with the back surface facing the die pad. The chip has at least one first contact and a plurality of second contacts. The first contact and the second contacts are disposed on the active surface. The first bonding wire electrically connects the first contact to the bus bar. The second bonding wire electrically connects the bus bar to one of the inner leads. The third bonding wires electrically connect the other inner leads to the second contacts. The die pad, the inner leads, the bus bar, the chip, the first bonding wire, the second bonding wire and the third bonding wires are wrapped inside the encapsulant.

In one embodiment of the present invention, the die pad has a down-set with a second height difference from the inner leads.

In one embodiment of the present invention, the first contact includes power source contact, ground contact or signal contact.

The present invention also provides a chip package structure including a chip, a lead frame, at least one first bonding wire, at least one second bonding wire, a plurality of third bonding wires and an encapsulant. The chip has an active surface and at least one first contact and a plurality of second contact disposed thereon. The chip is fixed underneath the lead frame. The lead frame includes a plurality of inner leads and at least one bus bar. One end of the inner leads is disposed on the active surface and positioned around the first contact and the second contacts. The bus bar is disposed between the inner leads and the first and second contacts above the active surface. The bus bar has an up-set with a height difference from the inner leads. The first bonding wire electrically connects the first contact to the bus bar. The second bonding wire electrically connects the bus bar to one of the inner leads. The third bonding wires electrically connect the other of the inner leads to the second contacts. The inner leads, the bus bar, the chip, the first bonding wire, the second bonding wire and the third bonding wires are wrapped inside the encapsulant.

In one embodiment of the present invention, the first contact includes power source contact, ground contact or signal contact.

In the present invention, a height difference is set up between the bus bar and the inner leads. Therefore, the present invention is able to reduce the volume of the lead frame. In other words, the chip package structure in the present invention has the advantage of miniaturization.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
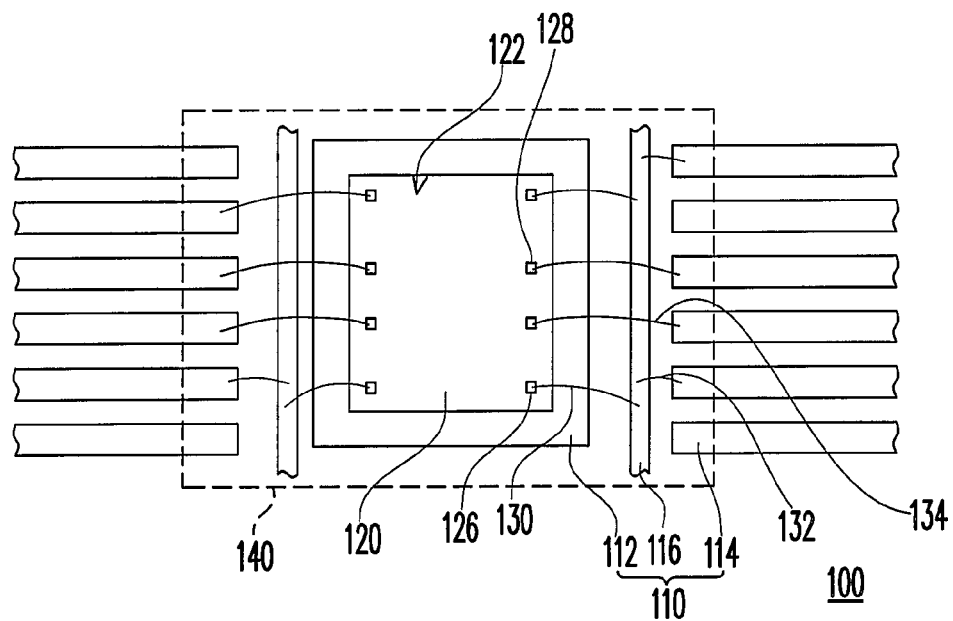
FIG. 1 is a top view of a conventional chip package.
Figure 2:
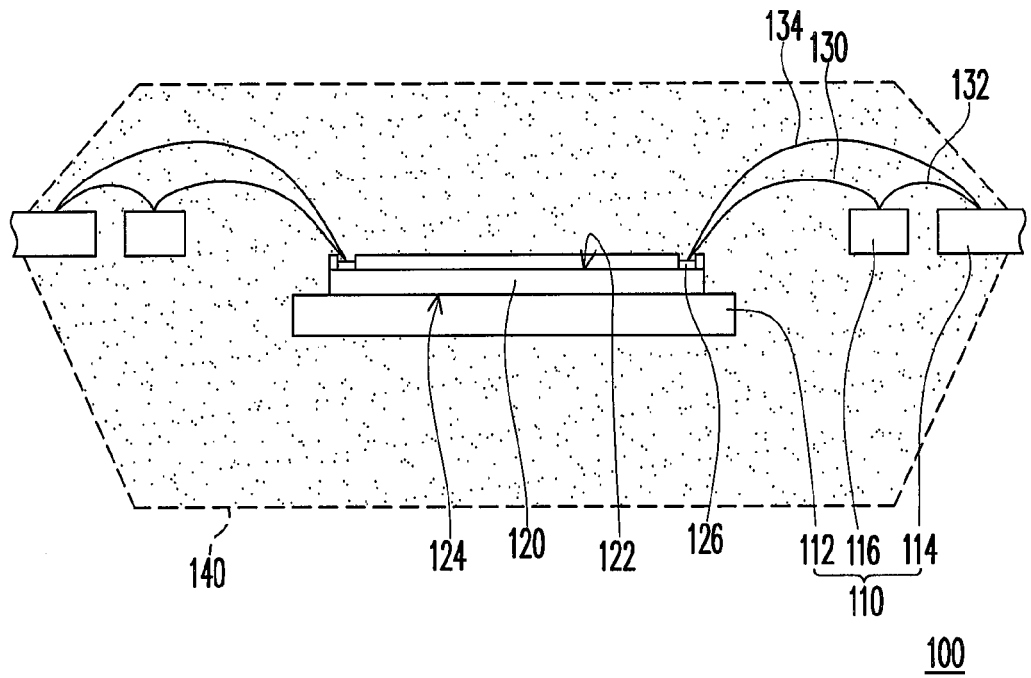
FIG. 2 is a schematic cross-sectional view of the chip package in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
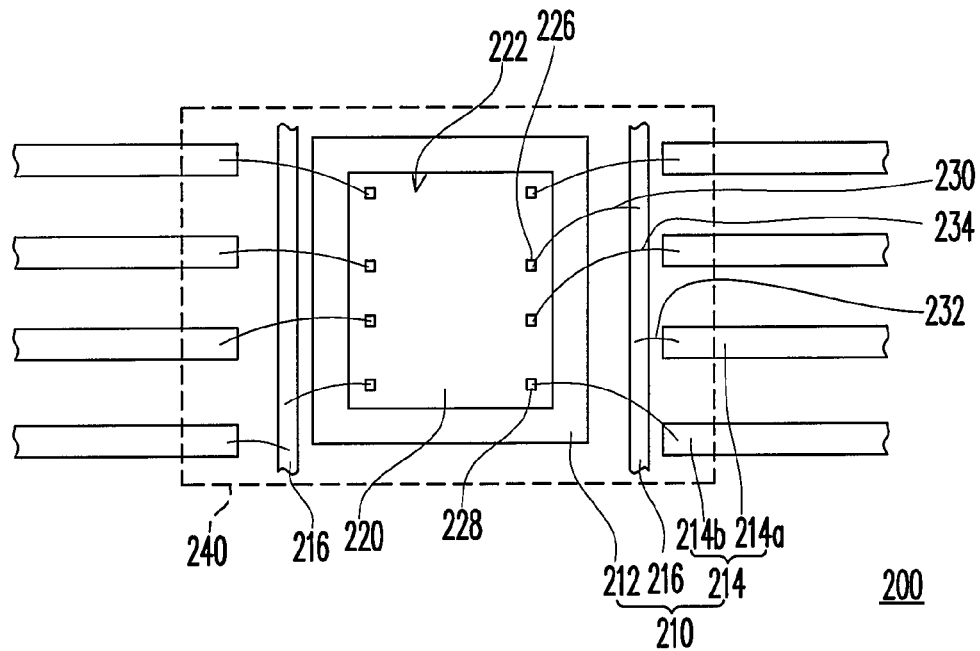
FIG. 3 is a top view of a chip package structure according to one embodiment of the present invention.
Figure 4:
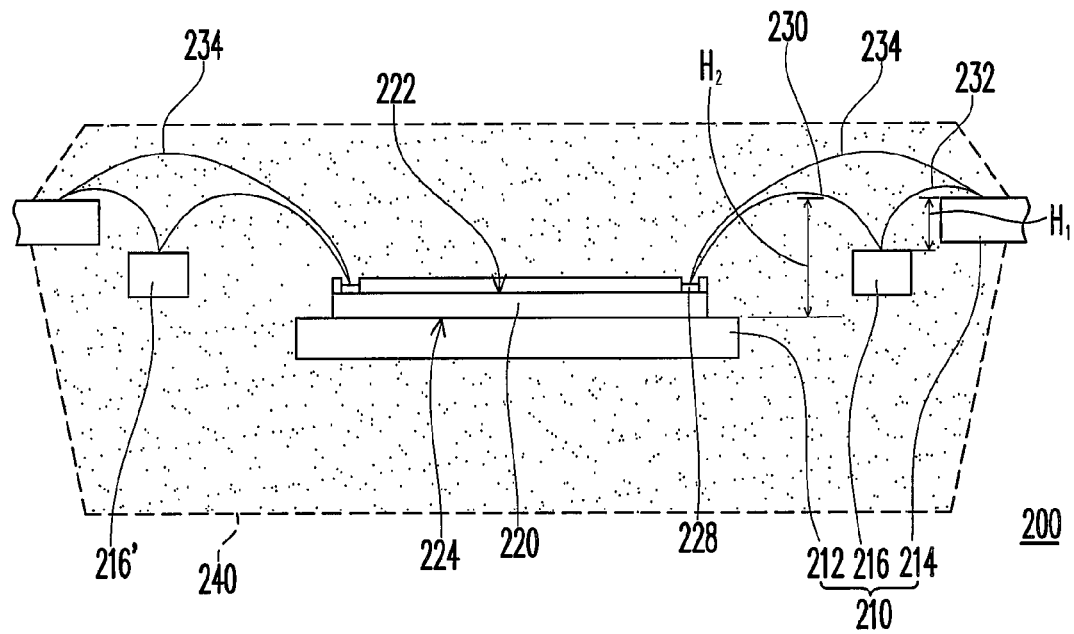
FIG. 4 is a schematic cross-sectional view of the chip package structure in FIG. 3.

FIG. 3 is a top view of a chip package structure according to one embodiment of the present invention. FIG. 4 is a schematic cross-sectional view of the chip package structure in FIG. 3. To simplify the following description, the encapsulant 240 in FIGS. 3 and 4 is transparent and the profile of the encapsulant 240 is only outlined with dash lines. As shown in FIGS. 3 and 4, the chip package structure 200 includes a lead frame 210, a chip 220, at least one first bonding wire 230, at least one second bonding wire 232, a plurality of third bonding wires 234 and an encapsulant 240.

The lead frame 210 includes a die pad 212, a plurality of inner leads 214 and at least one bus bar 216. The inner leads 214 are disposed around the die pad 212. The inner leads 214 include at least one first inner lead 214a and a plurality of second inner leads 214b. The bus bar 216 is disposed between the die pad 212 and the inner leads 214. Furthermore, the bus bar 216 has a down-set with a first height difference $H_1$ from the inner leads 214.

The chip 220 has an active surface 222 and a back surface 224 on the opposite side. The chip 220 is disposed on the die pad 212 such that the back surface 224 faces the die pad 212. The chip 220 has at least one first contact 226 and a plurality of second contacts 228. The first contact 226 and the second contacts 228 are disposed on the active surface 222.

The first bonding wire 230 electrically connects the first contact 226 to the bus bar 216. The second bonding wire 232 electrically connects the bus bar 216 to the first inner leads 214a. Thus, the first contact 226 can electrically connect with the first inner lead 214 through the first bonding wire 230, the bus bar 216 and the second bonding wire 232. The third bonding wires 234 electrically connect the second inner lead 214b to the second contacts 228.

The die pad 212, the inner leads 214, the bus bar 216, the chip 220, the first bonding wire 230, the second bonding wire 232 and the third bonding wires are wrapped inside the encapsulant 140. To increase reliability, the present embodiment preferably has a second height difference $H_2$ between the chip pad 212 and the inner leads 214 through a down-set.

Based on the foregoing structure, the present embodiment can use the bus bar 216 as a transfer contact for electrically connecting a plurality of first contacts 226 having the same voltage to their corresponding first inner leads 214a. For example, when the first contact 226 is a ground contact and the first inner lead 214a is a ground leads, the present embodiment can electrically connect the first contact 226 (the ground contact) to the first inner lead 214a (ground lead) through the first bonding wire 230, the bus bar 216 and the second bonding wire 232. It should be noted that, because the various parts of the lead frame 210 have the same voltage, the present embodiment allows the adjustment of the bonding locations of the first bonding wire 230, the second bonding wire 232 and the bus bar 216. As a result, the present embodiment can use a shorter wire (the total length of the first bonding wire 230 and the second bonding wire 232) to complete the electrical connection of the first contact 226 to the first inner leads 214a.

Obviously, in other embodiments of the present invention, the first contacts 226 can be power contacts or signal contacts. It should be noted that only a single first contact 226 could be electrically connected to the bus bar 216 through the first bonding wire 230 when the first contact 226 is a signal contact.

Aside from having a single bus bar 216, the lead frame 210 in the present embodiment can include several bus bars 216 to meet specific design requirements. For example, beside the bus bar 216 on one side of the die pad 212, another bus bar 216 can be disposed on the other side of the die pad 212.

When the lead frame 210 has a plurality of bus bars 216, the first contacts 226 in the present embodiment may include a plurality of ground contacts, a plurality of power contacts or a plurality of signal contacts. Moreover, the first contacts may also include any two of the three aforementioned types of contacts or all three types of contacts. However, it should be noted that the voltage of the first contacts 226 at any one time must be identical when the first contacts 226 are electrically connected to the same bus bar 216.

Figure 5:
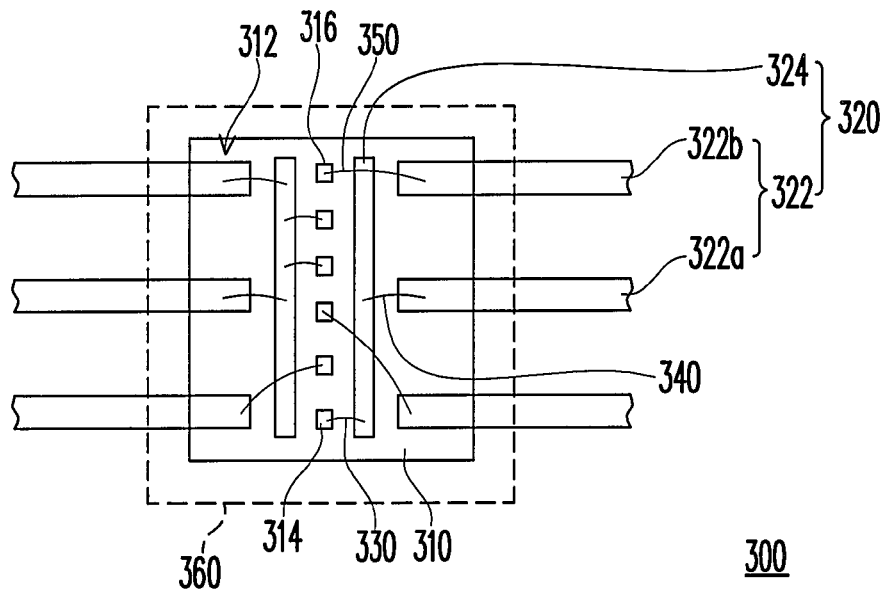
FIG. 5 is a top view of a chip package structure according to another embodiment of the present invention.
Figure 6:
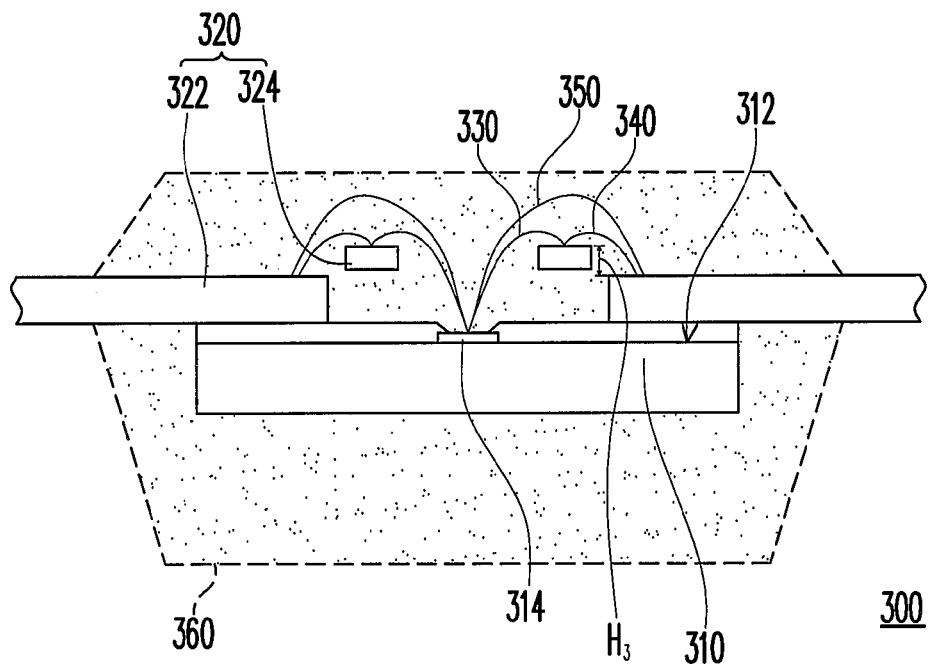
FIG. 6 is a schematic cross-sectional view of the chip package structure in FIG. 5.

FIG. 5 is a top view of a chip package structure according to another embodiment of the present invention. FIG. 6 is a schematic cross-sectional view of the chip package structure in FIG. 5. To simplify the following description, the encapsulant 360 in FIGS. 5 and 6 is transparent and the profile of the encapsulant 360 is only outlined with dash lines. As shown in FIGS. 5 and 6, the chip package structure 300 includes a chip 310, a lead frame 320, at least one first bonding wire 330, at least one second bonding wire 340, a plurality of third bonding wires 350 and an encapsulant 360.

The chip 310 has an active surface 312. In addition, the chip 310 also has at least one first contact 314 and a plurality of second contacts 316. The first contact 314 and the second contacts 316 are disposed on the active surface 312. The chip 310 is fixed under the lead frame 320. The lead frame 320 includes a plurality of inner leads 322 and at least one bus bar 324. One end of these inner leads 322 is disposed on the active surface 312 around the first contact 314 and the second contacts 316. The inner leads 322 include a plurality of first inner leads 322a and a plurality of second inner leads 322b.

The bus bar 324 is disposed between the inner leads 322 and the first and second contact 314, 316 above the active surface 212. The bus bar 324 has an up-set so that the bus bar 324 has a height difference $H_3$ with the inner leads 322.

The first bonding wire 330 electrically connects the first contact 314 to the bus bar 324. The second bonding wire 340 electrically connects the bus bar 324 to the first inner lead 322a. The third bonding wires 350 electrically connect the second inner leads 322b to the second contacts 316. The inner leads 322, the bus bar 324, the chip 310, the first bonding wire 330, the second bonding wire 340 and the third bonding wires 350 are wrapped inside the encapsulant 360.

Based on the foregoing structure, the present embodiment can use the bus bar 324 as a transfer contact for electrically connecting a plurality of first contacts 314 having the same voltage to their corresponding first inner leads 322a. For example, when the first contact 314 is a ground contact and the first inner lead 322a is a ground lead, the present embodiment can electrically connect the first contact 314 (the ground contact) to the first inner lead 314a (ground lead) through the first bonding wire 330, the bus bar 324 and the second bonding wire 340. It should be noted that, because the various parts of the bus bar 324 have the same voltage, the present embodiment allows the adjustment of the bonding locations of the first bonding wire 330, the second bonding wire 340 and the bus bar 324. As a result, the present embodiment can use a shorter wire (the total length of the first bonding wire 330 and the second bonding wire 340) to complete the electrical connection of the first contact 314 to the first inner leads 322a.

Obviously, in other embodiments of the present invention, the first contacts 314 can be power contacts or signal contacts. It should be noted that only a single first contact 314 could be electrically connected to the bus bar 324 through the first bonding wire 330 when the first contact 314 is a signal contact.

Aside from having a single bus bar 324, the lead frame 320 in the present embodiment can include several bus bars 324 to meet specific design requirements. For example, beside the bus bar 324 on one side of the first contacts 314, another bus bar 324 can be disposed on the other side of the first contacts 314.

When the lead frame 320 has a plurality of bus bars 324, the first contacts 314 in the present embodiment may include a plurality of ground contacts, a plurality of power contacts or a plurality of signal contacts. Moreover, the first contacts may also include any two of the three aforementioned types of contacts or all three types of contacts. However, it should be noted that the voltage of the first contacts 314 at any one time must be identical when the first contacts 314 are electrically connected to the same bus bar 324.

Compared with the conventional technique, the present invention is capable of reducing spatial occupation of the lead frame, shortening the length of the first bonding wire and the second bonding wire because of the height difference set up between the bus bar and the inner leads. Therefore, the chip package structure in the present invention has the advantage of miniaturization.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
   a lead frame, comprising:
      a die pad;
      a plurality of inner leads, disposed around the die pad;
      at least one bus bar, disposed between the die pad and the inner leads, wherein the bus bar has a down-set with a height difference from the inner leads;
   a chip having an active surface and a back surface on the opposite side, wherein the chip is disposed on the die pad with the back surface facing the die pad, and the chip has at least one first contact and a plurality of second contact disposed on the active surface;
   at least one first bonding wire electrically connecting the first contact to the bus bar;
   at least one second bonding wire electrically connecting the bus bar to one of the inner leads;
   a plurality of third bonding wires electrically connecting the other inner leads to the second contacts; and
   an encapsulant, wrapping around the die pad, the inner leads, the bus bar, the chip, the first bonding wire, the second bonding wire and the third bonding wires.

2. The chip package structure of claim 1, wherein the die pad has a down-set with a second height difference from the second inner leads.

3. The chip package structure of claim 1, wherein the first contact comprises power contact, ground contact or signal contact.

4. A chip package structure, comprising:
   a chip having an active surface and at least one first contact and a plurality of second contacts disposed on the active surface;
   a lead frame with the chip is disposed underneath, the lead frame comprising:
      a plurality of inner leads, one end of the inner leads is disposed on the active surface and located around the first contact and the second contacts;
      at least one bus bar disposed between the inner leads and the first and second contacts and located above the active surface, wherein the bus bar has an up-set with a height difference from the inner leads;
   at least one first bonding wire electrically connecting the first contact to the bus bar;
   at least one second bonding wire electrically connecting the bus bar to one of the inner leads;
   a plurality of third bonding wires electrically connecting the other inner leads to the second contacts; and
   an encapsulant, wrapping around the inner leads, the bus bar, the chip, the first bonding wire, the second bonding wire and the third bonding wires.

5. The chip package structure of claim 4, wherein the first contact comprises power contact, ground contact or signal contact.

* * * * *